Sept. 19, 1961 E. M. MURAD 3,001,112

TRANSISTOR AND METHOD OF MAKING SAME

Filed Jan. 19, 1956

INVENTOR.
EMIL M. MURAD

BY Lyon & Lyon

ATTORNEYS 3,001,112
Patented Sept. 19, 1961

3,001,112

TRANSISTOR AND METHOD OF MAKING SAME

Emil M. Murad, Glendale, Calif., assignor, by direct and mesne assignments, to Orbitec Corporation, New York, N.Y., a corporation of Delaware Filed Jan. 19, 1956, Ser. No. 560,120
8 Claims. (Cl. 317—235)

The present invention relates to semiconductor amplifier and oscillator devices generally referred to as transistors and to a method of making the same, and, in particular, transistors useful at high frequencies.

Extensive analytical and experimental studies of transistors disclose three essential features which determine the upper frequency limit of a transistor, namely: the base width and the associated transit-time effects of the minority charge carriers, the base resistance and the collector capacity. Early efforts to decrease all three parameters simultaneously to achieve a high frequency transistor were concentrated on point contact types of transistors with extremely small spacing between the emitter and collector elements. The production of such devices, however, is very difficult and their mortality is extremely high.

In junction transistors a reduction of all of these three parameters is not considered possible because their various effects contradict each other so that if one of these quantities is made small, another becomes very large. As a result, a compromise is usually made with the transistor having a short diffusion path on the one hand, and a small area of the collector junction on the other hand.

According to the prior art practices, there are several methods of obtaining such a compromise. Usually an indentation is created in the semiconductor material having a very thin wall at the bottom. It has been suggested that such indentation be formed by a mechanical process, for example drilling, but in such instance the techniques are considered crude and cannot be monitored sufficiently accurate. Other techniques for producing such indentations have also been suggested, as for example etching, by means of an electrochemical jet stream, ultrasonic attrition or high pressure abrasion similar to sand blasting. The disadvantages of all of these methods is that the diffusion path is established prior to the creation of the junction, and, therefore, control during the ensuing manufacturing process must be accomplished with high exactitude.

According to the present invention, a relatively small diffusion path is established at the time the collector element is joined to the semiconductor body, and subsequently the emitter element in the form of a fine wire electrode is bonded at an optimum position with respect to the collector element. The emitter wire preferably exhibits at least partial solid solubility in the semiconductor material and acts as a carrier for group III or group V impurities. In addition, mechanical stability is imparted to the finished transistor by means of an electrical bonding process which forces the nodal point of the emitter wire to the semiconductor surface.

A general object of the present invention is to provide improved means and techniques for making transistors in a relatively simple manner with the resulting product having performance characteristics which are stable, uniform and reliable under those conditions met in practice.

A specific object of the present invention is to provide transistors which may be operated at higher frequencies than has heretofore been possible.

Another specific object of the present invention is to provide improved means and techniques whereby a junction type of transistor is produced with an extremely short diffusion path or base width.

Another specific object of the present invention is to provide improved techniques whereby the adjustment of the effective diffusion zone is accomplished in novel manner using an electrical formation process for achieving a transistor that may be operated at relatively high frequencies.

Another specific object of the present invention is to provide improved means and techniques whereby minority charge carriers injected by the emitter of the transistor upon the collector are focused in a novel manner.

Another specific object of the present invention is to provide an improved transistor operable at high frequencies in which the junction has a small area and provides a relatively small capacity.

The features of the present invention which are believed to be novel are set forth with particularity in the appended claims. This invention itself, both as to its organization and manner of operation, together with further objects and advantages thereof, may be best understood by reference to the following description taken in connection with the accompanying drawings in which:

Figure 1:
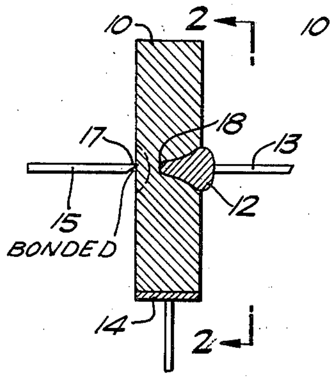
FIGURE 1 is generally a transverse sectional view through a triode form of transistor embodying features of the present invention.
Figure 2:
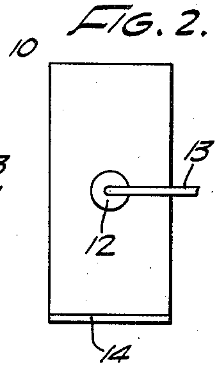
FIGURE 2 is a view in elevation taken generally in the direction indicated by the arrows 2—2 in FIGURE 1.

Referring to the form of the transistor illustrated in FIGURES 1 and 2, such transistor is originally in the form of a slab 10 of semiconductor material as, for example, germanium or silicon. The collector element 12 of, for example, indium or antimony is diffused or dissolved into one face of the semiconductor body 10 in accordance with important features of the present invention. A collector wire 13 is bonded to the collector pellet 12 to provide a suitable terminal. The base element 14 comprises a thin layer of conductor material bonded to one edge of the semiconductor body 10.

The emitter 15 is in the form of a fine wire which is bonded to the opposite fact of the semiconductor slab 10 in an optimum position with respect to the collector pellet 12. The nodal point of the bonded barrier transistor is indicated at 17 and the frontal zone of the alloy barrier is indicated by the reference numeral 18.

In the manufacture of the transistors illustrated herein, the base electrode 14 and the collector pellet 12 are initially attached to the semiconductor body 10, and the emitter wire 15 is bonded to the body 10 in an optimum position after the collector pellet 12 is diffused or dissolved into the body 10. The base electrode 14 may be in the form of a metal plating and, as indicated above, may be connected to the body 10 either before the collector pellet 12 is diffused or dissolved into the body 10, at the same time as the collector pellet 12 is diffused or dissolved into the body 10, or after such collector pellet 12 is diffused or dissolved into the body 10.

Figure 6:
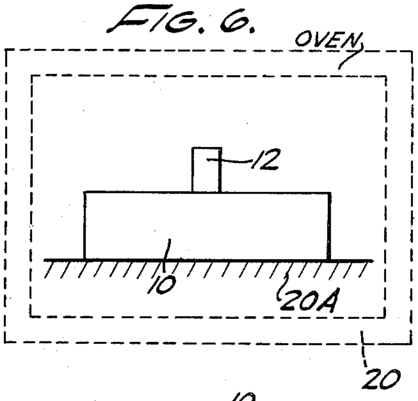
FIGURE 6 illustrates one step in the process of making transistors having the structures shown herein.

In accordance with an important feature of the present invention, a relatively small charge carrier diffusion path in the order of .0001" is established at the time the collector pellet 12 is diffused or dissolved into the slab 10. The collector pellet 12 originally may be in the form of a small cylinder or sphere of indium, antimony, or other appropriate group III or VI element and is simply placed on one face of the slab 10, as indicated in FIGURE 6, although it is understood that the particular shape of pellet, either cylindrical or spherical, is not considered critical. The assembly shown in FIGURE 6 is placed in an oven 20 with the slab resting on, for example, a shelf 20A in such oven 20 and with the pellet 12 resting on the slab and the assembly is subjected to a temperature at which solid state diffusion or solution takes place at a relatively high rate, for example at 500 degrees centigrade for germanium without any pressure between the slab 10 and the pellet 12, other than that pressure due to gravity forces acting on the pellet. The assembly in the oven is heated by radiation, conduction, convection, induction or any combination of such means. At the time of such heating, a portion of the pellet diffuses or dissolves into the slab to the extent shown in FIGURE 1.

Figure 7:
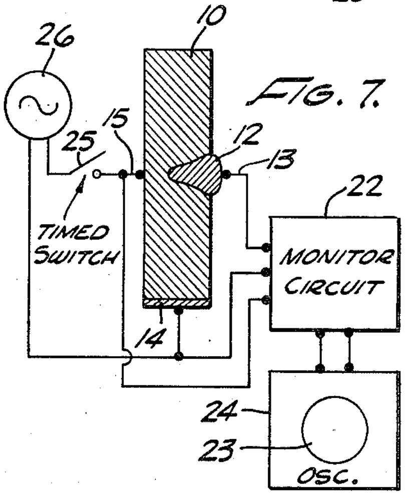
FIGURE 7 illustrates in schematic form the monitoring or measuring circuitry and the means for bonding the emitter to the semiconductor body.

After the collector pellet is thus diffused or dissolved into the body, the assembly is allowed to return to normal ambient temperatures and a base electrode 14 may be then plated on one edge of the slab. With the collector 12 and base elements 14 thus bonded to the slab 10 of the semiconductor material, the emitter electrode 15, in the form of a thin wire, is bonded at an optimum position on that face of the slab which is opposite to the face into which the collector pellet is diffused or dissolved. The emitter wire 15 is bonded to such face using resistance heating or any other heating method. Such heating may be accomplished using 20 volts A.C. between the emitter wire 15 and the base electrode 14 with the resulting current allowed to flow for approximately ⅕ of a second, using apparatus illustrated in FIGURE 7. The heating current, however, is allowed to flow to achieve such bonding only after the emitter wire is correctly positioned for the optimum transistor characteristic. Such characteristic is monitored using a suitable monitor 22 producing indications on the face of the associated cathode ray tube 23 of oscilloscope 24. The transistor characteristic which is monitored is the current gain between the collector 13 and the emitter electrode 15, i.e. the characteristic usually referred to as alpha$_{CE}$; and when such current gain is highest, the alternating current heating circuit including the source 26 is closed by the timed switch 25 to bond the wire to the slab 10 at such optimum position. When switch 25 is closed, heating current for bonding purposes flows through the A.C. source 26, through switch 25, through the emitter wire 15, through the slab 10 and through the base element 14, and back to source 26. However, before the switch 25 is closed to achieve the bonding between elements 15 and 10, the emitter wire 15 is first placed in an optimum position, as mentioned previously, using conventional measuring equipment which includes a conventional monitor circuit 22 and a conventional oscilloscope 24 for measuring or determining in conventional manner such characteristic alpha$_{CE}$. For this purpose, the other three input terminals of the conventional monitor circuit 22 are connected respectively to the emitter wire 15 which is in contact with the slab, the base element 14 and the collector wire 13. The output of the monitor circuit is applied to, for example, the vertical deflection plates of the oscilloscope which incorporates conventional means for developing time base cathode beam sweeps. When the emitter wire 15 is so placed that the observed vertical deflection on the cathode ray tube 23 is at maximum, the timed switch 25 is closed to effect the bonding between wire 15 and slab 10.

By these expedients, the collector to base capacitance is relatively small and yet there are relatively high current gains which otherwise would be lowered when, according to prior art practices, the area of the collector junction is increased due to the difficulty of producing extremely small emitter junctions by the usual alloy process.

It is understood that using these techniques, a junction transistor may be produced of either NPN or PNP type, depending upon the materials used. The collector may be of acceptor or donor material and originally may be a cylinder having a diameter of .010" and a height of .015". The base 10 may be in the form of a wafer or slab of either N or P type with a thickness of .003". The diffusion of the collector into the base may be accomplished by adequately controlled thermal energy in the form of radiation, convection, conduction, or induction applied in sufficient amount and for a sufficient period of time until the frontal zone of acceptor or donor semiconductor alloy penetration, as the case may be, approaches the opposite side of the semiconductor wafer to within approximately .0001" of the surface. A base region thickness of this dimension is thus established prior to the formation of the emitter.

Since the value of current gain at elevated frequencies is generally proportional within limits to the ratio of collector to emitter junction area and the absolute size of the collector junction area, it is desired that the emitter junction area be as small as possible. Thus, the emitter 15 is a wire drawn to approximately .003" diameter, and in such case the emitter junction area is a very small fraction of the area of the collector junction.

Figure 3A:
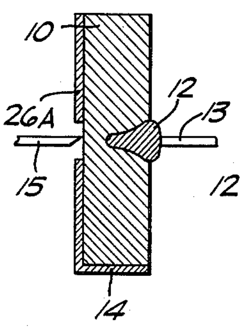
FIGURE 3A shows another modified form of transistor and corresponds to a view of the same as in FIGURE 1, but in this instance a plated conducting surface surrounds the emitter, said surface contacting the base.
Figure 3:
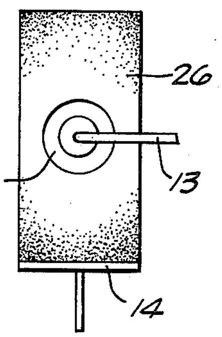
FIGURE 3 shows a modified form of transistor and corresponds to a view of the same as in FIGURE 2, but in this instance a plated conducting surface surrounds the collector, said surface contacting the base.

The transistor shown in FIGURE 3 is identical with the transistor shown in FIGURE 2, but, in this instance, the junction region is surrounded by the electrode 26 which is metal plated onto the semiconductor body 10, with such conducting plating being in contact with the base electrode 14, but not contacting the junction region itself.

In the modified arrangement shown in FIGURE 3A, the emitter 15 is surrounded by the electrode 26A which is metal plated onto the semiconductor body 10, with such conducting plating being in contact with the base electrode 14.

Figure 5:
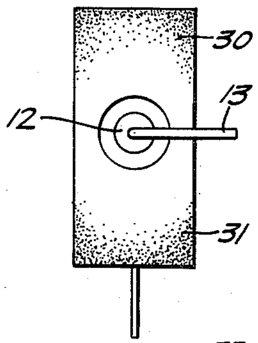
FIGURE 5 is an elevational view of the bonded barrier transistor, as shown in FIGURE 4, taken generally as indicated by the line 5—5 in FIGURE 4.
Figure 4:
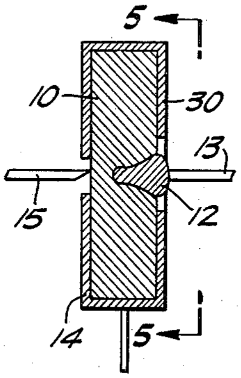
FIGURE 4 is a sectional view through another modified transistor of the triode type embodying the present invention and in this instance a plated conducting surface surrounds both the emitter and collector and contacts the base.

In the arrangement shown in FIGURES 4 and 5, the conductive coating surrounding the junction region and plated on the semiconductor body 10 extends downwardly sufficiently to contact the base electrode 14 at each side of the slab 10.

Figure 8:
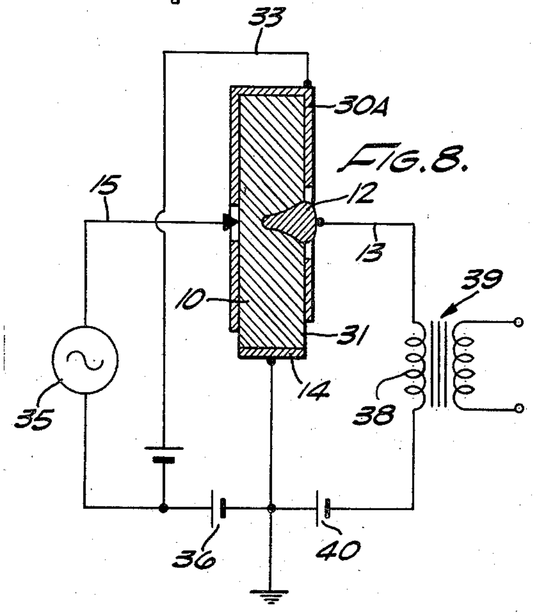
FIGURE 8 illustrates in schematic form an amplifier incorporating another modified transistor of the tetrode type.

In FIGURE 8 the conductive coating 30A surrounding the junction region and plated on the semiconductor body 10 does not extend to the base electrode but is separated therefrom by the space 31. A wire 33 soldered to the conductive coating or plating 30 serves as a suitable terminal for connection in a circuit, for example the circuit shown in FIGURE 8.

In FIGURE 8 the transistor in the form of a tetrode functions as a radio frequency amplifier and the base electrode 14 is grounded. The emitter electrode 15 is connected to one terminal of a high frequency source 35, the other terminal of source 35 being connected to the "hot" terminal of the D.C. source 36 and having the other terminal grounded. The collector electrode 13 is connected to one terminal of the primary winding 38 of output transformer 39, the other terminal of such winding 38 being connected to the D.C. source 40 which has one terminal grounded.

The electrode 30A which serves as a focusing electrode is connected to the ungrounded terminal of D.C. source 36. This electrode 30A serves to focus the minority charge carriers injected at the emitter, thus reducing transit time effects and collector capacity to a minimum thereby increasing the power gain of the device at elevated frequencies.

While the particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

I claim:

1. In the art of producing a transistor having a semiconductor body and a pair of spaced electrodes, diffusing one of said elements into said body, adjusting the position of the other element on the surface of the body, observing an electrical characteristic of said transistor while the position of said other element is being adjusted, and bonding said other element to said body when said characteristic is optimum.

2. In the art of producing transistors having a semiconductor body and a pair of spaced elements, diffusing or dissolving one of said elements into said body, adjusting the position of the other element on the surface of said body, measuring an electrical characteristic of said transistor while the position of said other element is being adjusted, and producing an electrical current flow between said other element and said body for a controlled time interval when said characteristic is optimum, of sufficient intensity to bond said other element to the surface of said body.

3. A transistor in the form of a slab of semiconductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material surrounding said pellet and bonded in conductive relationship to said base electrode.

4. A transistor in the form of a slab of semiconductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material surrounding said thin wire and bonded in conductive relationship to said base electrode.

5. A transistor in the form of a slab of semi-conductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material, surrounding said thin wire and said pellet and bonded in conductive relationship to said base electrode.

6. A transistor in the form of a slab of semiconductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material surrounding said pellet and said wire and bonded to said body in non-conductive relationship to said base electrode to provide a focusing electrode.

7. A transistor in the form of a slab of semi-conductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material surrounding said pellet and bonded to said body in non-conductive relationship to said base electrode to provide a focusing electrode.

8. A transistor in the form of a slab of semi-conductor material with a pair of opposite faces and a side edge, a collector pellet diffused or dissolved into one of said faces, a thin wire bonded to the other face with a portion of the thin wire in solution in the semiconductor material, a base electrode bonded to said edge, and conductive material surrounding said wire and bonded to said body in non-conductive relationship thereto to provide a focusing electrode.

References Cited in the file of this patent

UNITED STATES PATENTS

| | | |
|---|---|---|
| 2,713,132 | Mathews et al. | July 12, 1955 |
| 2,725,315 | Fuller | Nov. 29, 1955 |
| 2,750,542 | Armstrong et al. | June 12, 1956 |
| 2,789,257 | Donkersgoed et al. | April 16, 1957 |
| 2,792,539 | Lehovec | May 14, 1957 |
| 2,793,332 | Alexander et al. | May 21, 1957 |
| 2,802,159 | Stump | Aug. 6, 1957 |
| 2,821,493 | Carman | Jan. 28, 1958 |
| 2,840,770 | Jackson | June 24, 1958 |
| 2,842,668 | Rutz | July 8, 1958 |
| 2,850,688 | Silvey | Sept. 2, 1958 |